United States Patent [19]

Harvey

[11] Patent Number: 4,528,465
[45] Date of Patent: Jul. 9, 1985

[54] SEMICONDUCTOR CIRCUIT ALTERNATELY OPERATIVE AS A DATA LATCH AND A LOGIC GATE

[75] Inventor: Barry Harvey, Palo Alto, Calif.

[73] Assignee: Advanced Micro Devices, Inc., Sunnyvale, Calif.

[21] Appl. No.: 441,457

[22] Filed: Nov. 15, 1982

[51] Int. Cl.³ .................. H03K 3/023; H03K 3/037; H03K 3/295; H03K 19/086

[52] U.S. Cl. .................. 307/454; 307/455; 307/272 A

[58] Field of Search .............. 307/445, 289, 290, 291, 307/292, 592, 200 A, 454, 455, 473, 272 R

[56] References Cited

U.S. PATENT DOCUMENTS

| | | | |
|---|---|---|---|
| 3,394,267 | 12/1964 | Schmidt | 307/455 |
| 3,514,640 | 5/1970 | Fett | 307/289 |
| 3,529,184 | 9/1970 | Conklin | 307/290 |
| 3,663,837 | 5/1972 | Epstein et al. | 307/289 |
| 3,796,896 | 3/1974 | Fulton et al. | 307/455 X |
| 3,800,168 | 3/1974 | Cochran | 307/290 |
| 4,219,744 | 8/1980 | Shinn | 307/291 X |
| 4,276,485 | 6/1981 | Rydval | 307/291 X |
| 4,301,379 | 11/1981 | Reinert | 307/291 X |

Primary Examiner—Stanley D. Miller
Assistant Examiner—David R. Bertelson
Attorney, Agent, or Firm—Patrick T. King; J. Vincent Tortolano

[57] ABSTRACT

A high speed latch for integrated circuit applications employs a linear differential logic type gate and a cross coupled differential pair storage element which share common load terminals. The cross coupled differential pair is transparent to the operation of the gate circuit in one condition and operative to store the current state of the gate circuit in another condition. The linear differential pair is constrained to draw less current than the gate when there is contention between previously latched data and input data. Thus, the linear differential pair does not inhibit operation of the gate when the gate is enabled. To provide the desired effect the gate uses a current source and the differential pair employs a resistor.

8 Claims, 2 Drawing Figures

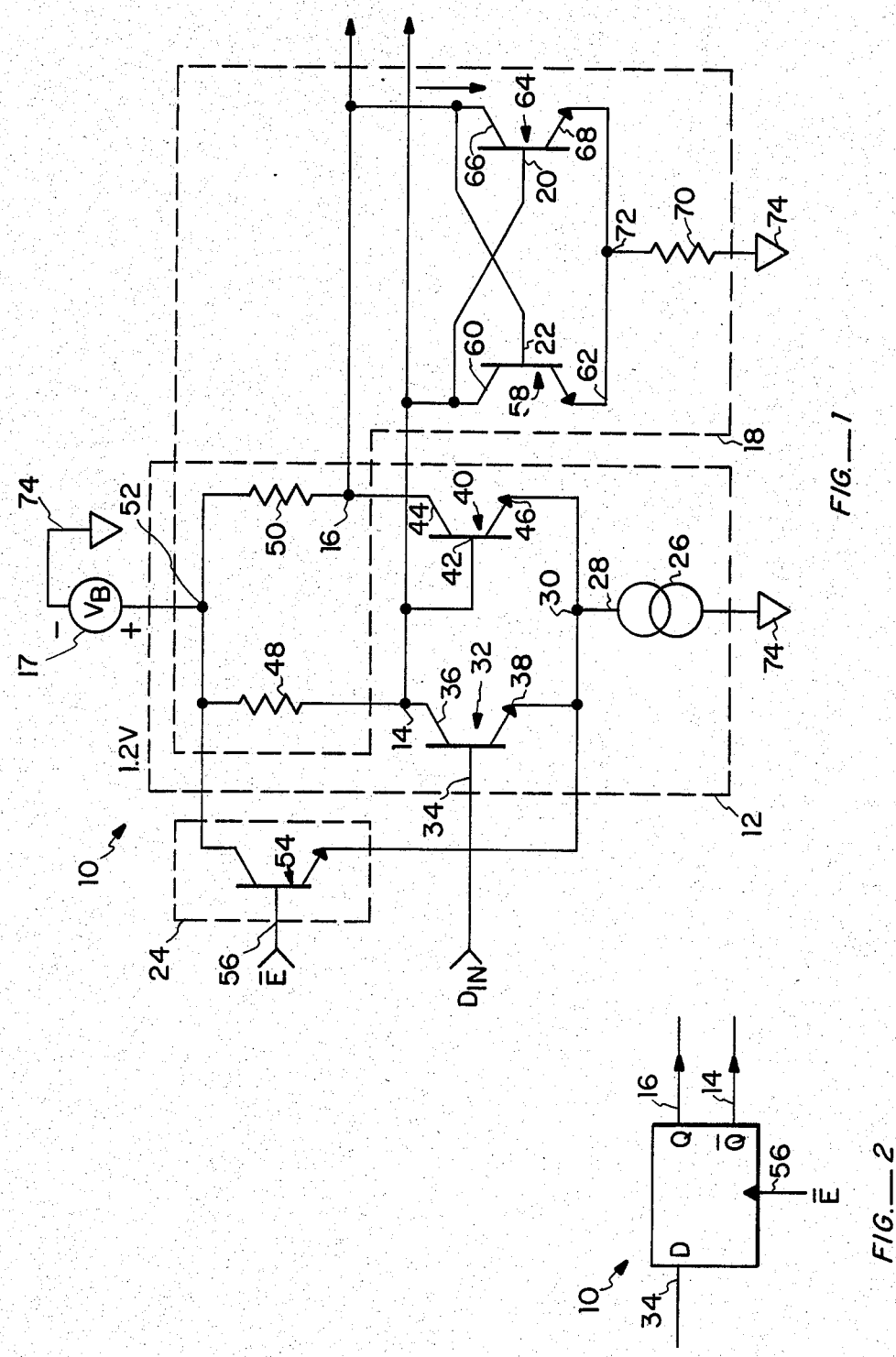
FIG._1
FIG._2 ions. ity, reliability are premium considerations.

SEMICONDUCTOR CIRCUIT ALTERNATELY OPERATIVE AS A DATA LATCH AND A LOGIC GATE

DESCRIPTION

Background of the Invention

1. Field of Invention

This invention relates to linear differential logic (LDL) and particularly to a semiconductor latch circuit employing linear differential logic which is operative in one selected condition as a simple gate and in another selected condition latched to the current output binary value of the gate.

Linear differential logic (LDL), is a nonsaturating logic form similar to emitter coupled logic (ECL). A significant feature of this logic form is the employment of a logic swing of 130 millivolts between a logic low level of 1.070 volts and a logic high level of 1.2 volts. The logic high level is selected to be the bandgap voltage of silicon. A logic gate supplied with power at the bandgap voltage gives a constant on to off ratio of current over a wide temperature range. The fact that the logic is nonsaturating allows very rapid operation and permits the logic to operate at a constant power, thereby eliminating power supply problems due to sudden changes in power supply requirements. The LDL logic form has been found to be particularly compatible with analog circuits, since potential interaction between the digital logic and sensitive analog circuits is avoided. Moreover, relatively good noise immunity can be achieved even with the relatively low logic swing of 130 millivolts. In addition, relatively high speed logic can be achieved without expensive high-speed components such as Schottky diodes. Very low currents are required to achieve speeds comparable to ECL (Emitter Coupled Logic) speeds.

There are many applications for latch circuits employing high speed logic. Latch circuits for example may be used as data storage registers, digital delays and in other functions. In particular, there is a need for high speed and highly compact circuit building blocks for integrated circuit applications where density, reliability and speed are premium considerations.

2. Description of the Prior Art

Linear differential logic has found usefulness in high speed microprocessor compatible analog-to-digital converters and digital-to-analog converters. See for example "Logic and Interfacing Aspects of High-Speed A/D Converters" by Gerard McGlinchey and Edgar Macachor, Reprint WESCON/81 Professional Program Six Record 23, Third Article.

SUMMARY OF THE INVENTION

According to the invention, a high speed latch for integrated circuit applications employs a linear differential logic type gate and a cross coupled differential pair storage element which share common load terminals. The cross coupled differential pair is transparent to the operation of the gate circuit in one condition and operative to store the current state of the gate circuit in another condition. The linear differential pair is constrained to draw less current than the gate when there is contention between previously latched data and input data. Thus, the linear differential pair does not inhibit operation of the gate when the gate is enabled. To provide the desired effect the gate uses a current source and the differential pair employs a resistor.

BRIEF DESCRIPTION OF THE DRAWINGS

FIG. 1 is a schematic diagram of a latch circuit according to the invention.

FIG. 2 is a block diagram of the circuit of FIG. 1.

DESCRIPTION OF SPECIFIC EMBODIMENTS

Referring to FIG. 1, a latch circuit 10 according to the invention comprises a linear differential logic gate element 12 coupled in a novel manner to a storage element 18 and provided with a selection element 24. Referring to FIG. 2, a block diagram of the circuit is shown. The latch circuit 10 in an enabled state is a gate having complementary outputs and in the complement of the enabled state is operative to latch the current condition of the gate which can be read at the complementary outputs. For the convenience of reference, the input corresponds to a first input terminal 34, the inverted output corresponds to a first node 14, the noninverted output corresponds to a second node 16 and the enable input corresponds to a control input terminal 56.

In FIG. 1, the LDL gate element 12 in the latch circuit 10 comprises a Schmitt trigger circuit with positive feedback and provided with a first load node 14 and second load node 16. A first current element 26, shown here as a generalized current source, is coupled between a voltage reference 74 and a common current node 30 through a terminal 28. The voltage reference 74 is typically a ground reference. The gate is intended to be powered at a fixed voltage differential $V_B$ by an external power supply 17, the voltage differential ideally set to the bandgap voltage of the substrate upon which the circuit elements are constructed. In the case of a silicon substrate, the bandgap voltage is about 1.2 volts. Thus, a common voltage node 52 is maintained at a voltage level of 1.2 volts above the voltage reference 74 in embodiments employing NPN transistors.

The gate element employs a first stage device 32, such as an NPN transistor having a first load terminal 36 coupled to the first load node 14, a first common terminal 38 coupled to the common current node 30 and a first input terminal 34, the first input terminal 34 being the data input terminal. Further first stage devices can be coupled in parallel between the first load node 14 and the common current node 30. It will be apparent to those of ordinary skill in the art that the gate element 12 can be provided with multiple parallel inputs to form multiple input OR gates or NAND gates or the like, depending on the choice of logic definition.

The gate element 12 further includes a second stage device 40 such as an NPN transistor having a second load terminal 44 connected to the second load node 16, a second common terminal 46 coupled to the common current node 30 and a second input terminal 42, the second input terminal 42 connected to the first load node 14. A first load element 48, for example, a two-terminal resistor is provided between the common voltage node 52 and the first load node 14. A second load element 50, for example, a two-terminal resistor matched to the first load element, is coupled between the common voltage node 52 and the second load node 16.

In operation, the gate element 12, when enabled, is provided with current from the external power supply 17 to the common voltage node 52, which current is directed through either the first load element 48 or through the second load element 50 to develop a voltage drop and thence through the first stage device 32 or the second stage device 40 to the common current node 30. The current path depends on the state of the first input terminal 34. A high voltage causes current to be drawn through the first load element 48 to effect a lower voltage at the first load node 14 relative to the second load node 16, since second input terminal 42 turns the second stage device 40 off. The current through the common current node 30 is set by the current drawing capacity of the first current element 26, one terminal 28 of which is coupled to the common current node 30 and the other terminal being at the voltage reference 74.

Operation of the gate element 12 is subject to control by a selection element 24. The selection element 24 is for example a switch 54 connecting the common voltage node 52 to the common current node 30 and operable under control of a binary signal applied at a control input terminal 56.

The storage element 18 having a first steering input terminal 20 coupled to the first load node 14 and a second steering input terminal 22 coupled to the second load node 16 is operative to store, i.e., latch, the current states of the load nodes 14 and 16 prior to the closing of switch 54. The storage element is provided with a first differential element 58, such as a transistor, and a matched second differential element 64, the first differential element 58 and the second differential element 64 forming a cross coupled pair. The first differential element 58 includes a third load terminal 60 coupled to the first load node 14 with the first steering input terminal 20, and a third common terminal 62 coupled to a second common node 72. The second differential element 64 includes a fourth load terminal 66 coupled to the second load terminal 16 together with the second steering input terminal 22, and a fourth common terminal 68 coupled to the second common node 72. Connected to the second common node 72 is an emitter resistor 70, the other terminal of which is connected to the voltage reference 74.

In order for this circuit to operate correctly and most efficiently over the maximum temperature range, the biasing of the storage element 18 is such that the emitter resistor 70 draws less current than the first current element 26 when there is a momentary contention between data input and stored data in the storage element 18. However, when contention is resolved, the current through current element 26 is designed to be the same as the current through the emitter resistor 70. In the enabled state, wherein the switch 54 is nonconducting, the storage element 18 is transparent to the operation of the gate element 12. The storage element 18 simply tracks the state of the gate element 12, resolving momentary contention between the data into the input 54 and the data stored in the storage element 18. The first load element 48 and second load element 50 switch between a voltage level of 1.2 volts and 1.07 volts, assuming the external power supply 17 is maintained at the bandgap voltage of 1.2 volts. The first stage device 32 and the second stage device 40 need not saturate. The second common node 72 is constrained to be maintained at a voltage level of one diode drop below the more positive of the voltages at the first load node 14 and the second load node 16, or approximately 500 millivolts, by the level of voltage drop at node 72 through the emitter resistor 70. The voltage at the steering input will be maintained at 130 millivolts below the voltage at the second common terminal 72 to maintain one of the differential elements at an off state while the other differential element is maintained at the supply voltage level.

When the selection device 54 changes state to become conductive the gate element 12 becomes disabled. The storage element 18 latches the load nodes 14 and 16 at their current complementary states. The first stage device 32 and second stage device 40 are essentially eliminated from the circuit by the switch 54 between the voltage node 52 and the first common node 30 leaving only the storage element 18 to maintain a voltage differential between the load nodes 14 and 16. This state remains latched until the switch 54 is opened and new data is applied at the first input terminal 34. The storage element 18 then tracks the new data.

The invention described herein provides a simple and extremely fast latch for various logic applications, particularly integrated circuit design. The invention has been explained with reference to specific embodiments. Other embodiments will be apparent to those of ordinary skill in the art. It is therefore not intended that this invention be limited except as limited by the appended claims.

What is claimed is:

1. A data latch circuit comprising:
   a common voltage node coupled to a first source of potential;
   a logic gate element having a first common current node coupled to a first current element, said first current element also being coupled to a second source of potential; said logic gate element also having a first input means and a second input means, and having an output means, said output means having a first load and a second load said first load and said second load being coupled together to said common voltage node, said logic gate element also having a first common terminal and a second common terminal coupled together at said common current node to said first current element;
   a storage element having a first input terminal coupled through said first load to said common voltage node, and having a second input terminal coupled through said second load to said common voltage node, said storage element also having a resistor, said resistor having one terminal coupled to a second common current node, and another terminal coupled to said second source of potential, said storage element also having a third common terminal and a fourth common terminal coupled together to said second common current node, said second source of potential being at a differential relative to said first source of potential; and
   a selection element having a switch means coupled between said common voltage node and said first common current node, said switch means having a control input terminal for controlling the opening and closing of said switch means in response to a binary logic level selection signal, such that when said switch means is open, said selection element is in a first selection control state, and when said switch means is closed, said selection element is in a second selection control state;
   wherein said data latch circuit is operative as a gate in said first selection control state and as a data latch in said second selection control state.

2. A data latch circuit according to claim 1 wherein said logic gate element comprises:
- a first stage device having a first load terminal, said first stage device connected between said first load terminal and said first common terminal, said first stage device having a control terminal connected to said first input means providing an external input of a binary logic level data signal;
- a second stage device having a second load terminal, said second stage device connected between said second load terminal and said second common terminal, said second stage device having a control terminal connected to said second input means, said second input means being coupled to said first load terminal at at said first load;
- said first load and said second load each having one terminal coupled to said common voltage node, said first load having another terminal coupled at said first load terminal, and said second load having another terminal coupled at said second load terminal thereby to define at least a single input linear differential logic gate element.

3. A data latch circuit according to claim 1 wherein said storage element comprises:
- a first differential element connected between a first load terminal and said third common terminal, and having a control terminal connected to said second input terminal; and
- a second differential element connected between a second load terminal and said fourth common terminal, and having a control terminal connected to said first input terminal;
- said first load terminal being coupled through said first load to said first source of potential, and said second load terminal being coupled through said second load to said first source of potential.

4. A data latch circuit according to claim 2 wherein said storage element comprises:
- a first differential element connected between a third load terminal and said third common terminal, and having a control terminal connected to said second input terminal; and
- a second differential element connected between a fourth load terminal and said fourth common terminal, and having a control terminal connected to said first input terminal;
- said third load terminal being coupled through said first load to said first source of potential, and said fourth load terminal being coupled through said second load to said first source of potential.

5. A data latch circuit according to claim 1 wherein said storage element is constrained to draw current from said logic gate element.

6. A data latch according to claim 2 wherein said storage element is constrained to draw current from either one of said first load node and second load node, said first current element having a current drawing capacity greater than the current drawing capacity of said storage element when there is contention between the states of data stored in said storage element and the state of data applied to said logic gate element.

7. A data latch circuit according to claim 3 wherein said first current element has a greater current drawing capacity than said resistor when there is contention between the state of data stored in said storage element and the state of data applied to said logic gate element.

8. A data latch circuit according to claim 4 wherein said first current element has a greater current drawing capacity than said resistor when there is contention between the state of data stored in said storage element and the state of data applied to said logic gate element.

* * * * *